(12) United States Patent
Janick et al.

(10) Patent No.: US 8,103,907 B2
(45) Date of Patent: Jan. 24, 2012

(54) POWER ARCHITECTURE TO PROVIDE POWER SUPPLY REDUNDANCY

(75) Inventors: Jan M. Janick, Cary, NC (US); Randhir S. Malik, Cary, NC (US); Gregory J. McKnight, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 12/608,032

(22) Filed: Oct. 29, 2009

(65) Prior Publication Data

US 2011/0102996 A1    May 5, 2011

(51) Int. Cl.
*G06F 11/00* (2006.01)

(52) U.S. Cl. .......................................... 714/14; 714/22

(58) Field of Classification Search .................. None
See application file for complete search history.

(56) References Cited

U.S. PATENT DOCUMENTS

| | | | |
|---|---|---|---|
| 4,659,942 A * | 4/1987 | Volp | 307/19 |
| 5,325,363 A | 6/1994 | Lui | |
| 5,745,670 A | 4/1998 | Linde | |
| 6,125,448 A * | 9/2000 | Schwan et al. | 713/300 |
| 6,153,946 A | 11/2000 | Koch et al. | |
| 6,317,345 B1 | 11/2001 | Hayward et al. | |
| 6,608,403 B2 | 8/2003 | Liu et al. | |
| 6,664,657 B2 | 12/2003 | Hailey | |
| 6,747,369 B2 | 6/2004 | Griffith et al. | |
| 6,754,835 B2 * | 6/2004 | Bandholz et al. | 713/300 |
| 7,124,321 B2 | 10/2006 | Garnett et al. | |
| 7,340,620 B2 | 3/2008 | Dove | |
| 7,464,292 B2 | 12/2008 | Zansky et al. | |
| 7,502,950 B1 | 3/2009 | Brands | |
| 2003/0056125 A1 | 3/2003 | O'Conner et al. | |
| 2005/0071690 A1 | 3/2005 | Pomaranski et al. | |
| 2005/0071691 A1 | 3/2005 | Pomaranski et al. | |
| 2007/0260917 A1 * | 11/2007 | Inoue et al. | 714/14 |
| 2009/0077407 A1 | 3/2009 | Akimoto | |

OTHER PUBLICATIONS

George Schuellein "A New VRM Architecture for N=1 Redundancy at the Point of Load", Bodo's Power Systems—Oct. 2007, www.bodospower.com, pp. 28-29.
Ron Crews "Controller Monitors ORing FET Current and Voltage", Power Design—Power Electronics Technology, Sep. 2007, www.powerelectronics.com, pp. 54-55.

* cited by examiner

*Primary Examiner* — Michael Maskulinski
(74) *Attorney, Agent, or Firm* — Thomas Tyson; Jeffrey L. Streets

(57) ABSTRACT

Systems and methods that provide power redundancy to a computer system without increasing the number of independent power supplies used. A system having N computing modules may have power redundancy using N power supplies, where each of the N power supplies are able to supply more power than required by an associated computing module, and where all but one (N−1) of the power supplies collectively can immediately supply power to any one of the computing modules when the power supply associated with that computing module fails.

14 Claims, 5 Drawing Sheets

POWER ARCHITECTURE TO PROVIDE POWER SUPPLY REDUNDANCY

BACKGROUND OF THE INVENTION

1. Field of the Invention

The present invention relates to supplying power to a computer system, and more specifically relates to supplying power to a computer system when a power supply fails.

2. Background of the Related Art

A computer system is typically powered by one or more electrical power supplies intended to provide a continuous supply of power. An electronic power supply converts electricity from an electrical power source, such as an alternating current power outlet, to a form usable by a computer system and its various components. For example, a power supply may step-down voltages from a higher-voltage power outlet and convert alternating current (AC) to direct current (DC), to supply electrical power at one or more desired amperage and voltage.

Computer systems generally require a reliable source of electrical power to function properly. In the event of a power supply failure, calculations and data that required valuable processing time may be lost. A power supply failure can also lead to damaged computer components by suddenly removing power without the system having been properly shut down.

Redundant power supplies may be provided in a computer system in order to increase reliability of operation. Conventional systems providing power redundancy involve the use of additional power supplies, so that if one power supply fails, another power supply is available to compensate for the failed power supply. A simple system may, for example, provide "N+N" redundancy where a number (N) of computer systems are each provided with a number (N) of primary power supplies and a number (N) of secondary power supplies. In such a system, there are twice as many power supplies as computer systems. A further system may provide "N+1" redundancy, such that a number (N) of computer systems are grouped together and provided with a number (N) of power supplies (i.e., one power supply per computer system), plus a single (+1) backup power supply that can provide the power needed if any one of the N power supplies fails.

Power supplies take up valuable space and add significant capital costs, however, particularly in larger computer systems, such as rack-mountable server systems, that already require multiple power supplies. As a consequence, the increased reliability afforded by conventional systems providing power redundancy generally results in larger and more expensive systems.

BRIEF SUMMARY OF THE INVENTION

One embodiment of the present invention provides a system, comprising a plurality of computer housings, wherein each housing comprises a computing module and a power supply module, and wherein each power supply module includes an AC/DC converter having a DC output coupled to a DC input of the computing module within the same housing as the power supply module. The system further comprises a DC bus electronically coupled in parallel to each power supply module. Specifically, the DC output of each power supply module is electronically coupled to the DC bus through a circuit automatically directing DC from the DC bus to the DC output for supplying DC to the DC input of the computing module in response to the AC/DC converter being in an inactive state. The plurality of power supply modules in the system less the failed power supply module supply sufficient DC to the DC bus to operate the computing module coupled to the failed power supply.

Another embodiment of the invention provides a method, comprising each of a plurality of power supply modules converting AC to DC, and each power supply module supplying the DC to operate a computing module electronically coupled thereto, wherein each power supply module is also electronically coupled to a common DC bus. The method further comprises, in response to any power supply module failing to convert AC to DC, the failed power supply module automatically passing DC from the DC bus to the computing module coupled to the failed power supply, wherein the plurality of power supply modules less the failed power supply module supply sufficient DC to the DC bus to continue operating the computing module coupled to the failed power supply.

DETAILED DESCRIPTION OF THE INVENTION

Embodiments of the present invention are directed to systems and methods that provide power redundancy to a computer system without increasing the number of independent power supplies used. Therefore, a system having N computing modules may have power redundancy using N power supplies, where each of the N power supplies are able to supply more power than required by an associated computing module, and where all but one (N−1) of the power supplies collectively can immediately supply power to any one of the computing modules when the power supply associated with that computing module fails.

Figure 1:
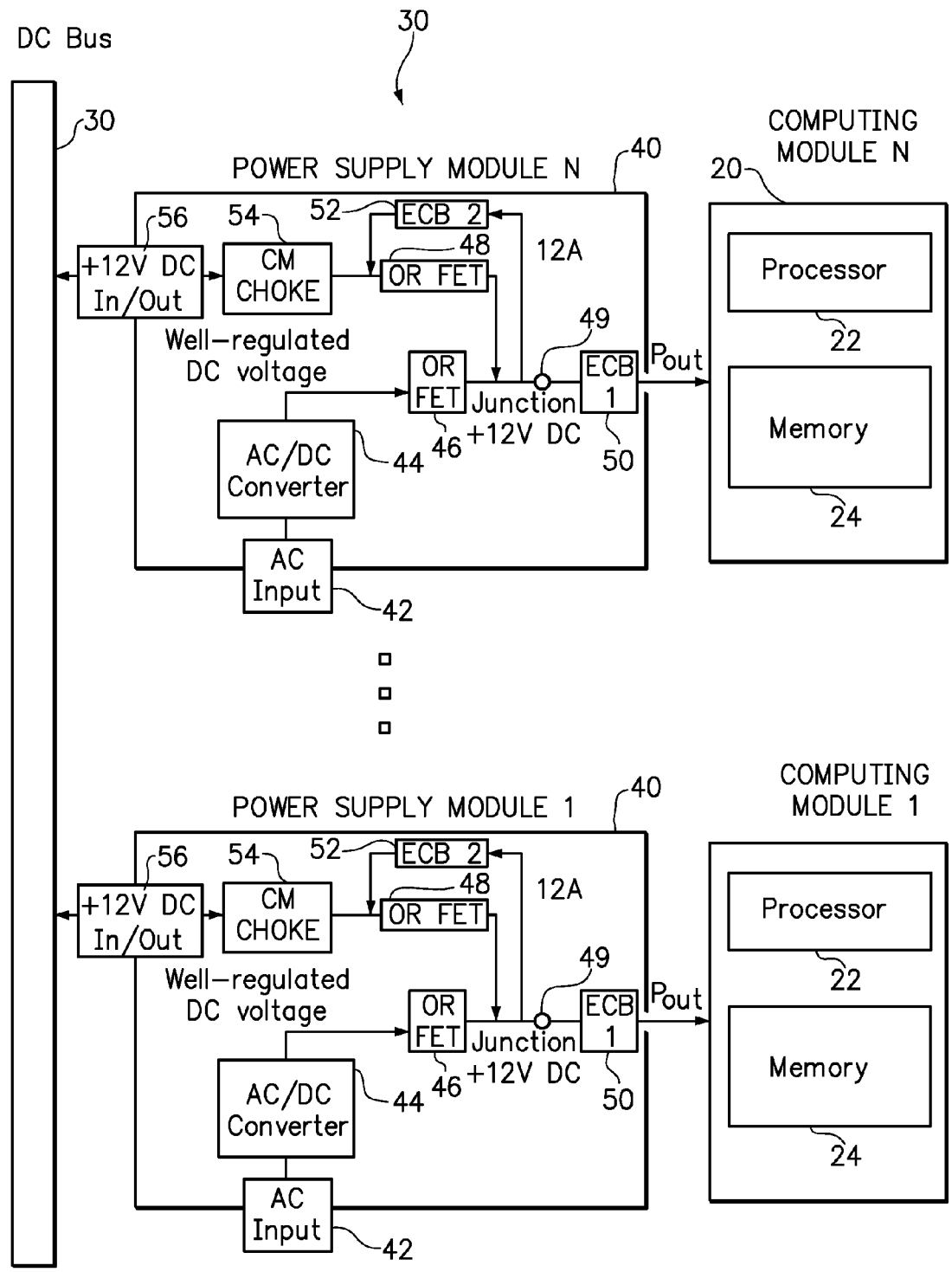
FIG. 1 is a block diagram of a system providing power redundancy to a computer system according to an embodiment of the invention.

FIG. 1 is a schematic circuit diagram of a computer system 10 providing power redundancy according to an embodiment of the invention. The computer system 10 includes a number "N" of computing modules 20 and an equal number of power supply modules 40. Each computing module 20 includes at least one processor 22 and memory 24. The processor 22 may include, for example, one or more central processing units (CPUs), for processing computer program instructions. The memory 24 may include, for example, one or more dual in-line memory modules (DIMMs) for storing random-access memory (RAM) and/or one or more flash-based or disk-based hard drives providing read-only memory (ROM). Instructions in the form of computer usable program code may be loaded from ROM to RAM for processing by the processors 22. Each computing module may also be independently powered. This modular configuration, wherein each computing module has its own processor(s) 22 and memory 24, allows the computing modules 20 to function independently of one another, or cooperatively with the other computing modules 20. For example, each computing module 20 may be a server, such as a chassis-mountable or rack-mountable blade server. Each blade server may individually perform computing functions (e.g. data processing) assigned to the single blade server individually. Alternatively, two or more of the blade servers may perform computing functions cooperatively, combining the capabilities and throughput of the multiple processors 22, memory 24, and other components.

Power redundancy is provided by the power supply modules 40 interconnected in parallel with a DC bus 30. Each individual power supply module 40 has a DC output that is electronically coupled to a respective one of the computing modules 20. Each computing module 20 is capable of operating with a particular steady-state power input ($P_{inp}$). Power may be internally regulated within each computing module 20, while the value of the steady-state power input remains constant. Each power supply module 40 is overdesigned to be capable of delivering a steady-state power output ($P_{out}$) that exceeds the power input required by the respective computing module 20. More particularly, the group of N power supply modules 40 provides a sufficient amount of excess power onto the DC bus to operate a computing module 20 even though its power supply module has failed. As will be further described below, in the event of failure of any one of the power supply modules 40, the remaining power supply modules will automatically provide enough power through the DC bus 30 to continue operating the computing module 20 normally supplied by the failed power supply module 40.

Components common to each of the power supply modules 40 are labeled for reference on one of the PSMs labeled "Power Supply Module N." The power supply module 40 has an AC input 42 for connecting to an electrical power source, such as an AC wall outlet. An AC/DC converter 44 is a primary component of the power supply module 40 responsible for converting AC to DC used to supply power to the respective computing module 20. The AC/DC converter 44 may be in one of two states, generally referred to herein as an active state and an inactive state. In the active state, the AC/DC converter 44 provides a well-regulated DC voltage output, e.g. +12V DC as illustrated, for powering the respective computing module 20. For example, in the active state, the AC/DC converter 44 in "Power Supply Module 1" is directly connected to and powers the "Computing Module 1," and the AC/DC converter 44 in "Power Supply Module N" is directly connected to and powers the "Computing Module N." The inactive state is typically associated with a power supply failure, wherein the AC/DC converter 44 provides little or no DC output.

A first OR-type field-effect transistor (FET), alternatively referred to as an "OR FET" 46, allows the +12V DC from the AC/DC converter 44 to flow only in the indicated direction while in the active state, to the respective computing module 20. The first OR FET 46 thus prevents any appreciable current flow from the DC bus 30 back through the OR FET 46 to the AC/DC converter 44, to prevent damage to the power supply module or other. A first electronic circuit breaker (ECB) 50 is optionally provided to prevent excessive current flow to the computing module 20.

The +12V DC is also applied from a +12V DC output junction 49 to the power supply bus 30. The circuit path from the +12V DC bus 49 to the DC bus 30 includes another ECB 52, an optional common mode (CM) choke 54, and a +12V DC input/output (in/out) connection 56. The +12V DC input/output (in/out) connection 56 connects the power supply module 40 to the DC bus 30. The optional CM choke 54 helps filter noise. The second ECB 52 provides current overflow protection between each power supply module 40 and the DC bus 30. When the AC/DC converter 44 of one of the power supply modules 40 changes to the inactive state, such that little or no current flows to the first OR FET 46 from the AC/DC converter 44, DC current will instead automatically flow from the DC bus 30 to the connected computing module 20, through the second OR FET 48, the junction 49, and the first ECB 50. The DC that flows from the DC bus 30 to the computing module 20 is provided to the DC bus 30 by the remaining computing modules 20, which have surplus power capacity.

In one embodiment, the various computing modules may have different power input requirements. Each power supply module 40 is overdesigned to provide a power output equal to the power input of the respective computing module 20, plus an additional amount of power equal to the largest power input of the various computing modules 20 divided by N−1.

Figure 2:
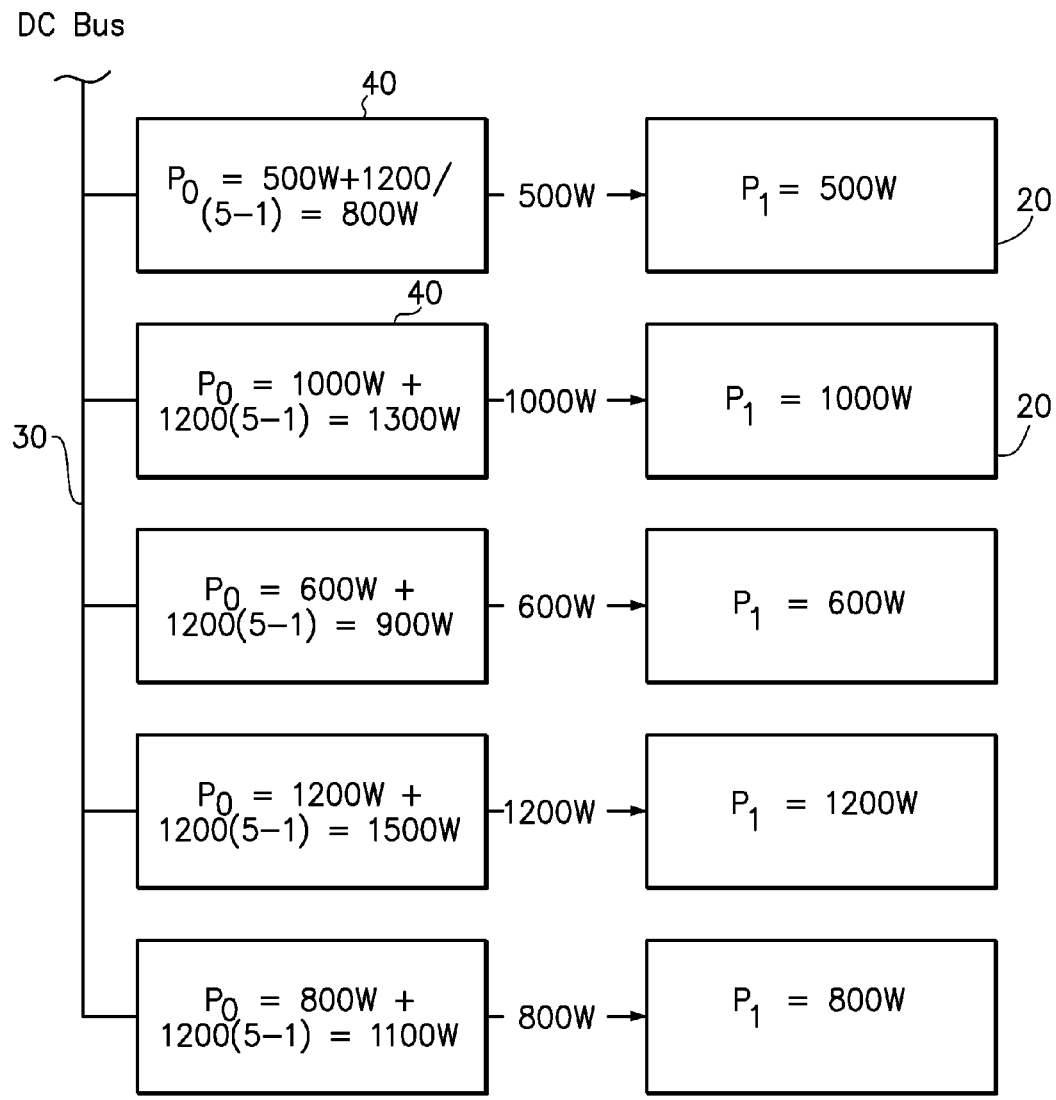
FIG. 2 is a block diagram of an example system having five computing modules and five respective power supplies connected to five computing modules.

To illustrate, FIG. 2 is a block diagram of an example computer system having five power supplies 40 and five respective computing modules 20 connected to the power supplies 40. The power requirements of the five computing modules 20 is, arranged in increasing order, 500 W, 600 W, 800 W, 1000 W, and 1200 W. Thus, N=5, and the power input required by the largest computing module is 1200 W. Therefore, each power supply module 40 is overdesigned to provide power to power for its respective computing module 20 and also provide effective redundancy of the power supplies. Since the largest power requirement required by any of the computing modules 20 in this system is 1200 W, each power supply must provide a surplus amount of power equal to 1200 W/(5−1)=300 W. In this manner, when any one of the five power supplies fails, the remaining four power supplies has enough excess power to continue operation of the computing module that is associated with the failed power supply.

Figure 3:
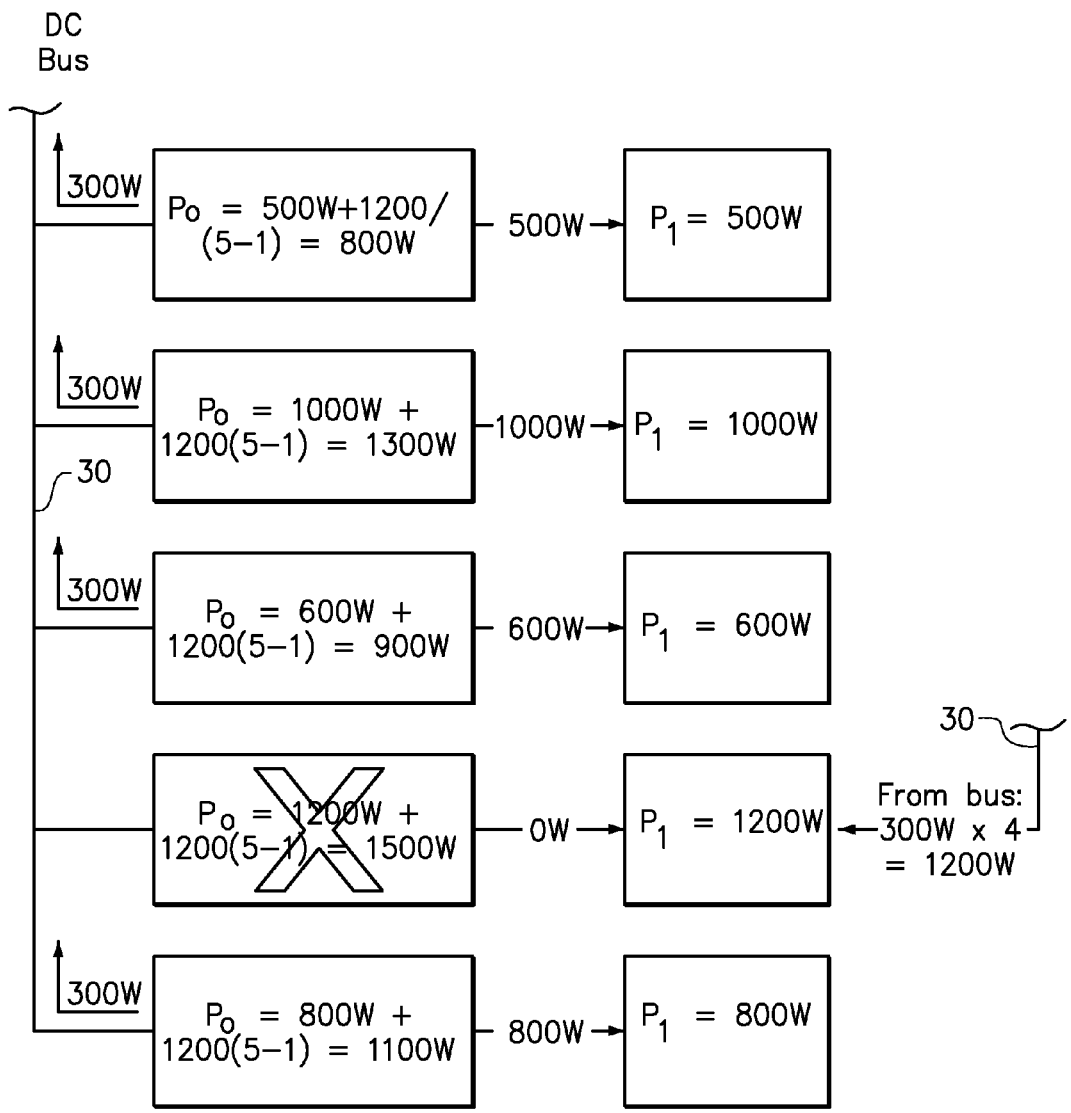
FIG. 3 is a block diagram of the system of FIG. 2, wherein a 1200 W power supply has failed.

If any one of the five power supply modules 40 were to fail, the remaining four power supply modules 40 have sufficient power output to continue to meet the power requirements of all five of the computing modules. For example, FIG. 3 is a block diagram of the computer system of FIG. 2, wherein the power supply associated with the 1200 W computing module has failed. The remaining four power supply modules (500 W, 600 W, 800 W, and 1000 W) will still power the directly connected computing modules, because the 300 W surplus power in each of the four remaining power supply modules 40 (i.e., a total excess power capacity of 1200 W) is sufficient to power the 1200 W computing module whose power supply module has failed.

Figure 4:
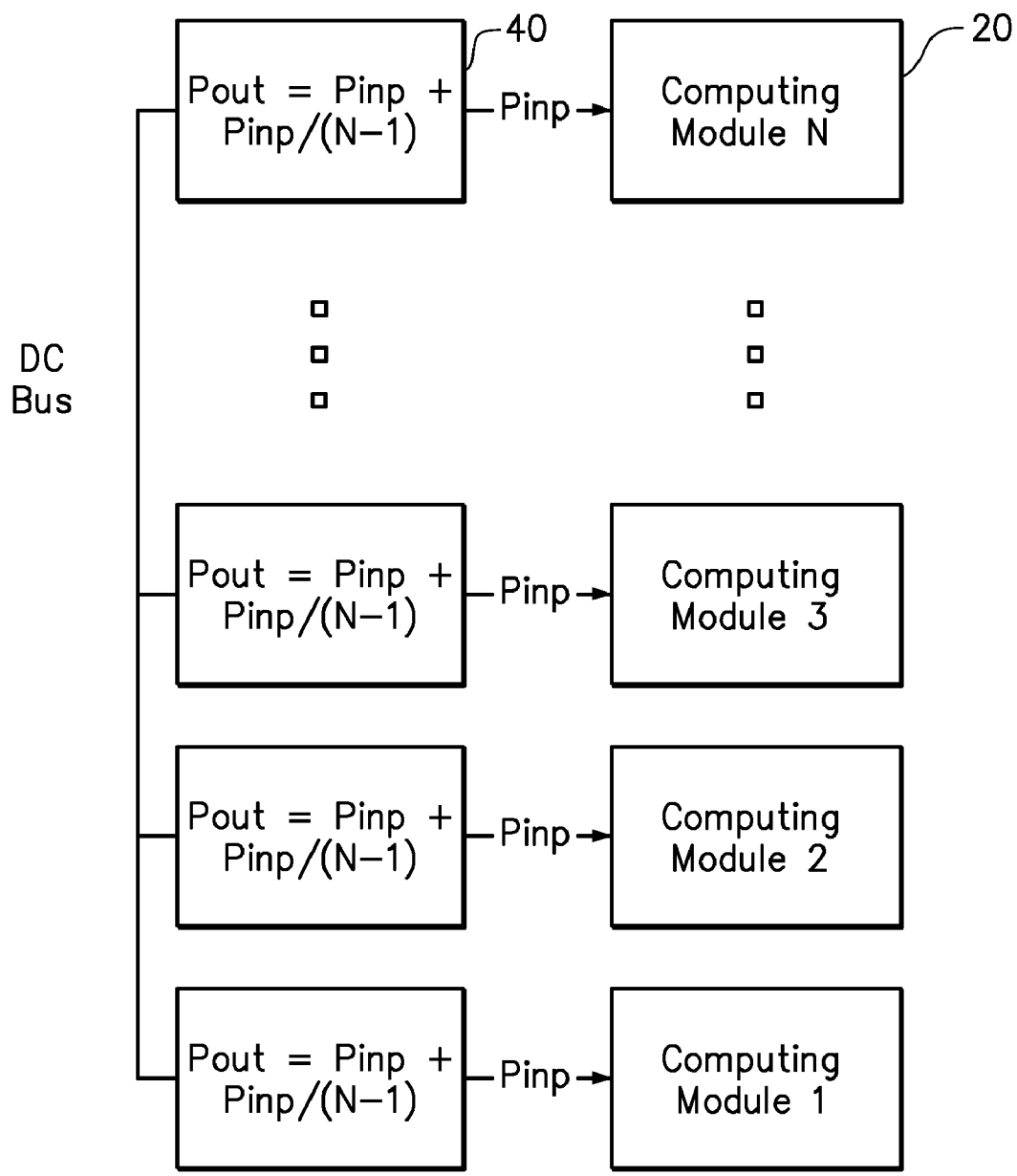
FIG. 4 is a block diagram of another example system having N computing modules and N respective power supplies, wherein each of the computing modules have an equal power input requirement and each of the power supply modules provide an equal power output.

FIG. 4 is a block diagram of another example computer system having N power supplies 40 and N respective computing modules 20, wherein the computing modules have an equal power input requirement and the power supply modules provide the same power output. In that case, each power supply module is overdesigned to provide the power required by one computing module plus an additional amount equal to the same power requirement divided by one fewer than the number of power supply modules (i.e., N−1 is the number of power supply modules that remain active). Stated mathematically, $P_{out}=P_{inp}+P_{inp}/(N-1)$.

To illustrate, suppose the system of FIG. 4 has seven computing modules and seven respective power supply modules (N=7). Each computing module has a power input requirement of 900 W. Therefore, the power output of each power supply modules is 900 W+900 W/(7−1)=1050 W. If any one of the power supply modules were to fail, the combined 900 W surplus (150 W*6 remaining power supply modules)

would be sufficient to power the 900 W computing module previously powered by the now-failed power supply module.

Figure 5:
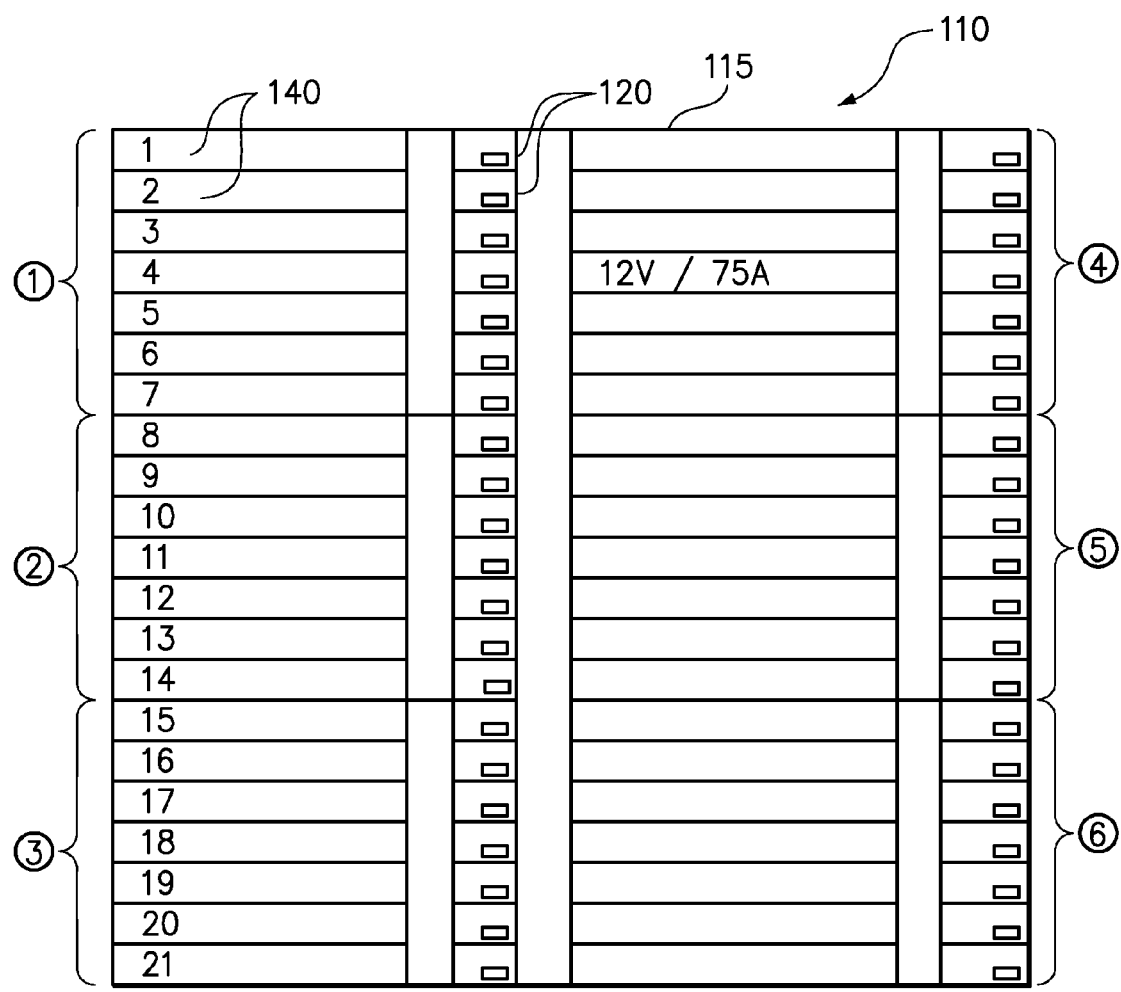
FIG. 5 is a front elevation view of a rack-mount computer system implementing multiple instances of power redundancy according to an embodiment of the invention.

FIG. 5 is a front elevation view of a rack-mount computer system 110 implementing multiple instances of power redundancy according to an embodiment of the invention. The system 110 includes six subsystems (labeled from 1 to 6), each subsystem including seven modular computing modules in the form of blade servers 140, for a total of forty-two blade servers 140. The system 110 further includes forty-two respective power supply modules 120 for powering the blade servers 140. The blade servers 140 and power supply modules 120 are arranged in a chassis or rack 115 having an equal number server bays and power supply module bays. Each of the subsystems (labeled 1 to 6) may, for example, operate as an independent N=7 system as in FIG. 4. It should be recognized that any one power supply within each of the subsystems may fail without causing any of the computing modules to go down. Still, unlike an N+1 redundancy system, the system does not require physical space or connection of an extra power supply module.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system, comprising:
a plurality of computer housings, each housing comprising a computing module and a power supply module, wherein each power supply module includes an AC/DC converter having a DC output coupled to a DC input of the computing module within the same housing as the power supply module; and
a DC bus electronically coupled in parallel to each power supply module, wherein the DC output of each power supply module is electronically coupled to the DC bus through a circuit automatically directing DC from the DC bus to the DC output for supplying DC to the DC input of the computing module in response to the AC/DC converter being in an inactive state, wherein each computing module has substantially the same power input requirement $P_i$, and wherein each power supply module has a power output $P_o$ greater than or equal to $P_i+P_i/(N-1)$, where N is the number of the power supplies.

2. The system of claim 1, wherein the circuit comprises a first OR FET allowing DC current to flow unidirectionally through the first OR FET from the AC/DC converter to the DC output.

3. The system of claim 2, wherein the circuit comprises a second OR FET preventing current flow from the DC bus to the respective computing module in response to the AC/DC converter being in the active state.

4. The system of claim 3, wherein the circuit comprises an electronic circuit breaker electronically coupled to control current from the DC output of the power supply modules to the DC bus.

5. The system of claim 4, wherein each power supply module further comprises a common mode choke coupled between the circuit and the DC bus.

6. The system of claim 1, wherein the power supply modules are hot swappable.

7. The method of claim 1, wherein the computing modules have different power input requirements and wherein each power supply module is overdesigned to provide a power output Po equal to the power input of the respective computing module, plus an additional amount of power equal to the largest power input of the computing modules divided by N−1.

8. A method, comprising:
each of a plurality of power supply modules converting AC to DC;
each power supply module supplying the DC to operate a computing module electronically coupled thereto, wherein each power supply module is also electronically coupled to a common DC bus; and
in response to a failed one of the power supply modules failing to convert AC to DC, automatically passing DC from the DC bus to the computing module coupled to the failed power supply, wherein each power supply module has the capacity to provide DC output in an amount equal to $P_i+P_i/(N-1)$, where $P_i$ is the minimum power required to power the computing module and N is the number of computing modules.

9. The method of claim 8, further comprising:
each power supply module converting AC to DC using an AC/DC converter; and
each power supply module allowing DC current flow in one direction through an OR FET from the AC/DC converter to the respective computing module when the AC/DC converter is in an active state and automatically preventing DC current flow in an opposing direction through the OR FET from the DC bus to the AC/DC converter when the AC/DC converter is in an inactive state.

10. The method of claim 9, further comprising:
each power supply module preventing DC on the DC bus from passing to the respective computing module in response to the AC/DC converter being in the active state, and automatically allowing current flow from the DC bus to the respective computing module in response to the AC/DC converter being in the inactive state.

11. The method of claim 8, wherein the computing modules have different power input requirements and wherein each power supply module is overdesigned to provide a power output Po equal to the power input of the respective computing module, plus an additional amount of power equal to the largest power input of the computing modules divided by N−1.

12. A system, comprising:
a chassis having an equal number of server bays and respective power supply module bays, wherein each server bay is configured to releasably receive exactly one of the servers and each power supply module bay is configured to releasably receive exactly one of the power supply modules, wherein each power supply module includes an AC/DC converter having a DC output coupled to a DC input of the respective server; and
a DC bus electronically coupled in parallel to each power supply module, wherein the DC output of each power supply module is electronically coupled to the DC bus through a circuit automatically directing DC from the DC bus to the DC output for supplying DC to the DC input of the server in response to the AC/DC converter being in an inactive state, wherein the plurality of power supply modules less the failed power supply module supply sufficient DC to the DC bus to operate the server coupled to the failed power supply.

13. The system of claim 12, wherein the power supply modules are hot swappable.

14. The system of claim 12, wherein the computing module bays are aligned with the power supply module bays, such that each power supply module bay is at the same relative position to a respective one of the computing module bays.

* * * * *